United States Patent
Adachi et al.

[11] Patent Number: 5,909,819
[45] Date of Patent: Jun. 8, 1999

[54] BOX-SHAPED PLASTIC HOUSING OF INTEGRALLY MOLDED RESIN

[75] Inventors: Katsura Adachi, Sagamihara; Makoto Usui, Yokohama; Kota Nishii, Isehara; Takashi Muraya, Kawasaki; Toshihiro Kobayashi, Machida; Kazuyuki Tamura, Mishima; Junichi Sato, Kawasaki, all of Japan

[73] Assignees: Fujitsu Limited, Kawasaki; Fujitsu Kasei Limited, Yokohama, both of Japan

[21] Appl. No.: 08/088,335

[22] Filed: Jul. 9, 1993

Related U.S. Application Data

[62] Division of application No. 07/775,561, Oct. 15, 1991, Pat. No. 5,254,304.

[30] Foreign Application Priority Data

Oct. 15, 1990 [JP] Japan .................. 2-2739190

[51] Int. Cl.$^6$ .................. B65D 90/04
[52] U.S. Cl. .................. 220/623
[58] Field of Search .................. 220/623, 660; 215/1 C

[56] References Cited

U.S. PATENT DOCUMENTS

| | | | |
|---|---|---|---|
| 1,182,466 | 5/1916 | Ferguson | 220/623 |
| 1,957,639 | 5/1934 | Goodwin | 220/623 |
| 2,527,085 | 10/1950 | Snow | 220/623 |
| 2,564,615 | 8/1951 | Tallberg | 425/444 |
| 3,259,356 | 7/1966 | Hehl | 425/444 |
| 3,536,040 | 10/1970 | Pickett | 220/660 |
| 3,951,375 | 4/1976 | Lovell | 249/107 |
| 4,125,246 | 11/1978 | von Holdt | 425/577 |
| 4,743,420 | 5/1988 | Dutt | 425/577 |
| 4,856,704 | 8/1989 | Tolson et al. | 229/2.5 R |
| 5,004,121 | 4/1991 | Howe | 220/660 |
| 5,158,817 | 10/1992 | Krishnakumar | 215/1 C |

FOREIGN PATENT DOCUMENTS

| | | |
|---|---|---|
| 2 370 569 | 6/1978 | France . |
| 673431 | 11/1964 | Italy .................. 220/343 |

OTHER PUBLICATIONS

Simonds, Herbert R., *The Encyclopedia Of Plastics Equipment*, 1965, p. 110.

Crosby et al., *Practical Guide To Plastics Applications*, 1974, pp. 82–84.

Dubois et al., *Plastics Mold Engineering Handbook*, 3rd Edition, 1978, pp. 386–390.

Schouenberg, H.J.E., "Reologisch produckt–en matrijsholteontwerp," *Kunststof En Rubber*, vol. 43, No. 5, May 1990, Rotterdam, NL, pp. 26–30.

*Primary Examiner*—Joseph M. Moy
*Attorney, Agent, or Firm*—Staas & Halsey

[57] ABSTRACT

A box-shaped plastic housing of integrally molded resin comprises a flat-shaped bottom wall having a peripheral edge and an upright wall extending upwardly from the peripheral edge of the bottom wall. The bottom wall and the upright wall cooperatively define an integral box-shaped molded product. The thickness of the bottom wall is in the range of two-thirds to one-third with respect to the thickness of the upright wall. The bottom wall is provided with at least one rib on its inner surface. The housing is produced by an injection molding process using a mold having a mold cavity which is provided with a groove on the inner surface of the cavity corresponding to each rib.

9 Claims, 7 Drawing Sheets

MODEL I, II

MODEL I

MODEL II

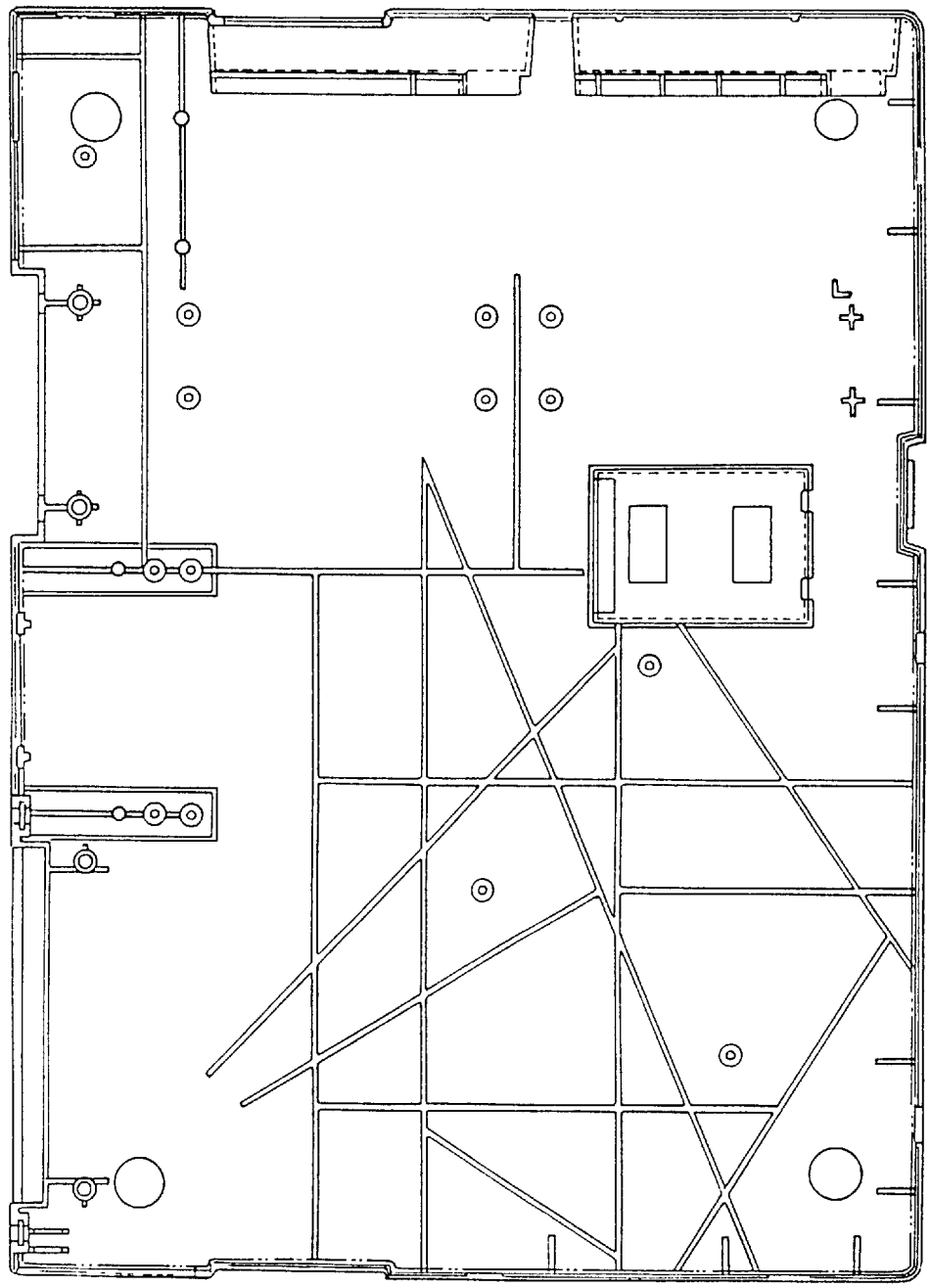

BOX-SHAPED PLASTIC HOUSING OF INTEGRALLY MOLDED RESIN

This application is a division of application Ser. No. 07/775,561, filed Oct. 15, 1991, now U.S. Pat. No. 5,254,304.

BACKGROUND OF THE INVENTION

1. Field of the Invention

This invention relates to a plastic housing structure, a process for producing the same, and a mold structure used in this process. Such a plastic housing structure is used for home electric or electronic units, toys, telephones, office automation machines, and the like, and more particularly is suitable for portable personal computers portable wordprocessors, or the like.

At present, portable units, in particular, notebook type personal computers, or portable wordprocessors have been made lighter and lighter in weight. It should be noted that the material of the housing structure of these machines has been changed from a heavy metal to a plastic material which is lighter in weight and of a reduced specific gravity. However, in these products, the weight of housing is still about one third of the total weight of the product. Thus, it has been required to reduce the wight of the housing structure.

2. Description of the Related Art

A conventionally known plastic housing for notebook type personal computers or portable wordprocessors has been required to be strong and easy to form. In this respect, it has been desired that the thickness of the housing be as uniform as possible, i.e., the thickness being 3 to 5 mm, or about 2.5 mm at a minimum. The specific gravity of a plastic material is generally 0.95 to 2.0, and the specific gravity of a plastic material of high strength is about 1.1 to 1.7. Therefore, it would seem impossible to reduce the weight i.e., the specific gravity, of the products by reducing the weight of housing material. One approach to this problem is to reduce the thickness of the housing walls. However, with this solution there arises the following problems in the prior art technique for forming plastic housings.

Thus, the following problems would arise if the thickness of the housing wall was reduced to 1.0 to 0.7 mm.

1) In general, the deformation of a plate due to a bending stress varies by amount inversely proportional to the thickness squared of the plate. Therefore, if the thickness of a plate is reduced by one-half (½), the deformation thereof will be increased four times. In such a manner, if the thickness of a plate is reduced, it becomes too easily deformable and, thus, the housing would become too weak to protect the contents thereof.

2) If the thickness of the housing wall is reduced, when the housing is made by injection molding, the melted resin must flow into a cavity which has the thin, wide area. Thus, a resistance to flow becomes very high and the pressure necessary for flowing the melted resin becomes also high. Therefore, an injection molding machine having a large injection capacity must be used. Also, if the pressure is to be thus increased, a large force is exerted on the mold to open the same, so that a variation of thickness of the housing wall might occur and fins might be generated. In addition, if the thickness of a housing wall is thin, the heated, molten resin comes into contact widely with the inner wall of the mold cavity, when flowing therein, so that the resin is rapidly cooled and thus the temperature of the resin is lowered. This means that the viscosity of the resin is increased and thus a part of resin might become solid before having reached to the terminal portions of the mold product which causes a so-called "short shot".

3) In order to prevent the above-mentioned variations and "short shot", if the thickness of the housing wall is increased at peripheral portions thereof and if the product is provided with ribs which serve as passages for the melted resin when forming the same by molding, the following secondary problems will arise. Namely, the resin will first flow into the portions of low resistance, i.e., the peripheral portions and the ribs, so that gas which could not be discharged to the outside, accummulates at a bottom wall and thin wall portions of the housing and, therefore, a so-called "burned mark (spot)" will arise due to "short shot" or a compression of gas.

4) In a final discharge process for taking the product out of the metal mold, if the product has a thin wall portion and if the product is pushed by a pusher engaging the thin wall portion thereof in the same manner as a general product, the thin wall portion may be damaged or deformed by the pusher, since such a portion has not been sufficiently solidified yet.

SUMMARY OF THE INVENTION

An object of the present invention is to provide a light weight plastic housing structure, a process for producing the same, and a mold structure used in the same process, capable of overcoming the above-mentioned problems in the prior art.

According to the present invention, there is provided a box-shaped plastic housing of integrally molded resin, said housing comprising a substantially flat-shaped bottom wall having a peripheral edge, an upright wall extending upwardly from said peripheral edge of said bottom wall, said bottom wall and said upright wall cooperatively defining an integral box-shaped mold structure, and the thickness of said bottom wall being in the range of from two-thirds to one-third with respect to the thickness of said upright wall.

In one embodiment, the average thickness of said upright wall is preferably not more than 3.0 mm.

In another embodiment, it is advantageous that said bottom wall and said upright wall have respective surface areas, and the surface area of said upright wall is not more than one-half of the area of said bottom wall.

In still another embodiment, it is advantageous that said bottom wall and said upright wall have respective inner surfaces, said respective inner surfaces cooperatively define an inside surface of said box-shaped structure, and said bottom wall is provided with at least one rib structure on said inner surface thereof.

In further embodiment, it is also advantageous that said rib structure is provided with at least one cylindrical boss having an axis perpendicular to a direction along which said rib structure extends, said cylindrical boss being used as a connector, e.g., as a threaded hole for a screw or a non-threaded hole for a self tapping screw and also used for extruding said molded product.

Otherwise, it is advantageous that at least two of said rib structures cross mutually at an intersection, said rib structures being provided at said intersection with a cylindrical boss having an axis perpendicular to the directions along which said rib structures extend, and said cylindrical boss being used as a connector, e.g., as a threaded hole for a screw or a non-threaded hole for a self tapping screw and also used for extruding said molded product.

According to another aspect of the present invention, there is provided with a process for producing a box-shaped plastic housing integrally molded with a resin; said housing comprising a substantially flat-shaped bottom wall having a peripheral edge, an upright wall extending upwardly from said peripheral edge of said bottom wall, said bottom wall and said upright wall cooperatively defining an integral box-shaped mold structure, the thickness of said bottom wall being in the range of from two-thirds to one-third with respect to the thickness of said upright wall, said bottom wall and said upright wall having respective inner surfaces, said respective inner surfaces cooperatively defining an inside surface of said box-shaped structure, and said bottom wall being provided with at least one rib structure on said inner surface thereof; and said process comprising an injection molding process using a mold having a mold cavity, said mold being provided with at least one groove on an inner surface of said cavity corresponding to said rib structures.

In one embodiment, said rib structure is provided with at least one cylindrical boss having an axis perpendicular to a direction along which said rib structure extends; said process comprising a step for discharging said plastic housing from said cavity by pushing said cylindrical boss with a cylindrical sleeve knockout pin.

In still another aspect of the present invention, there is provided a mold structure used for producing a box-shaped plastic housing of integrally molded resin, said housing comprising a substantially flat-shaped bottom wall having a peripheral edge, an upright wall extending upwardly from said peripheral edge of said bottom wall, said bottom wall and said upright wall cooperatively defining an integral box-shaped mold structure, the thickness of said bottom wall being in the range of two-thirds to one-third with respect to the thickness of said upright wall, said bottom wall and said upright wall having respective inner surfaces, and said respective inner surfaces cooperatively defining an inside surface of said box-shaped structure; said mold structure comprising at least two injection molds defining therebetween a mold cavity, one of said injection molds, which defines said inside surface of said box-shaped structure, being provided with at least two injection gates for injecting the resin into said cavity.

In one embodiment, said one of injection molds, which defines said inside surface of said box-shaped structure, is provided with at least one telescopic or knockout pin for removing any gas finally remaining in said cavity due to resin injection by said injection gates.

In another embodiment, one of said injection molds, which defines said inside surface of said box-shaped structure, is provided with at least one groove corresponding to said rib structures of said housing, and at least two injection gates on said grooves for injecting the resin into said cavity, and there is also provided on said grooves at least one telescopic or knockout pin of a material such as a sintered alloy or having an associated structure for selectively removing any gas finally remaining in said cavity due to resin injection by said injection gates.

BRIEF DESCRIPTION OF THE DRAWINGS

FIG. 7 is a plan view of a housing (i.e., a lower cover) of this invention used in a notebook type personal computer.

DESCRIPTION OF THE PREFERRED EMBODIMENTS

Figure 1A:
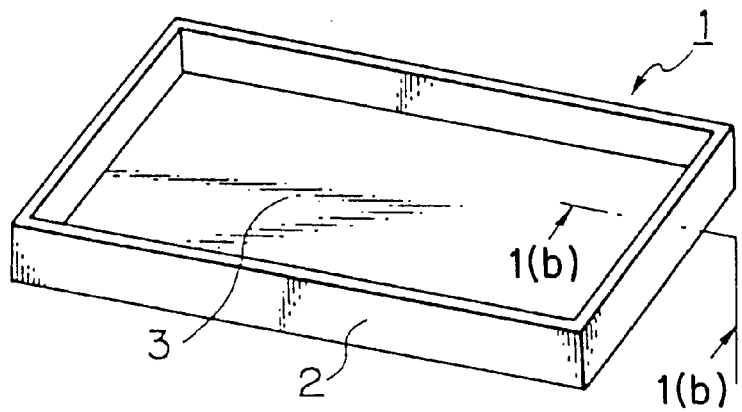
FIG. 1(a) is a schematic perspective view of a model I or II.
Figure 1B:
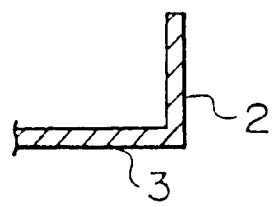
FIG. 1(b) is a cross-sectional view taken along line b—b in FIG. 1(a) and showing the model I.
Figure 1C:
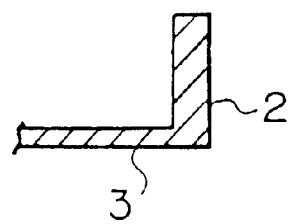
FIG. 1(c) is the same cross-sectional view as FIG. 1(b), but showing the model II.
Figure 2A:
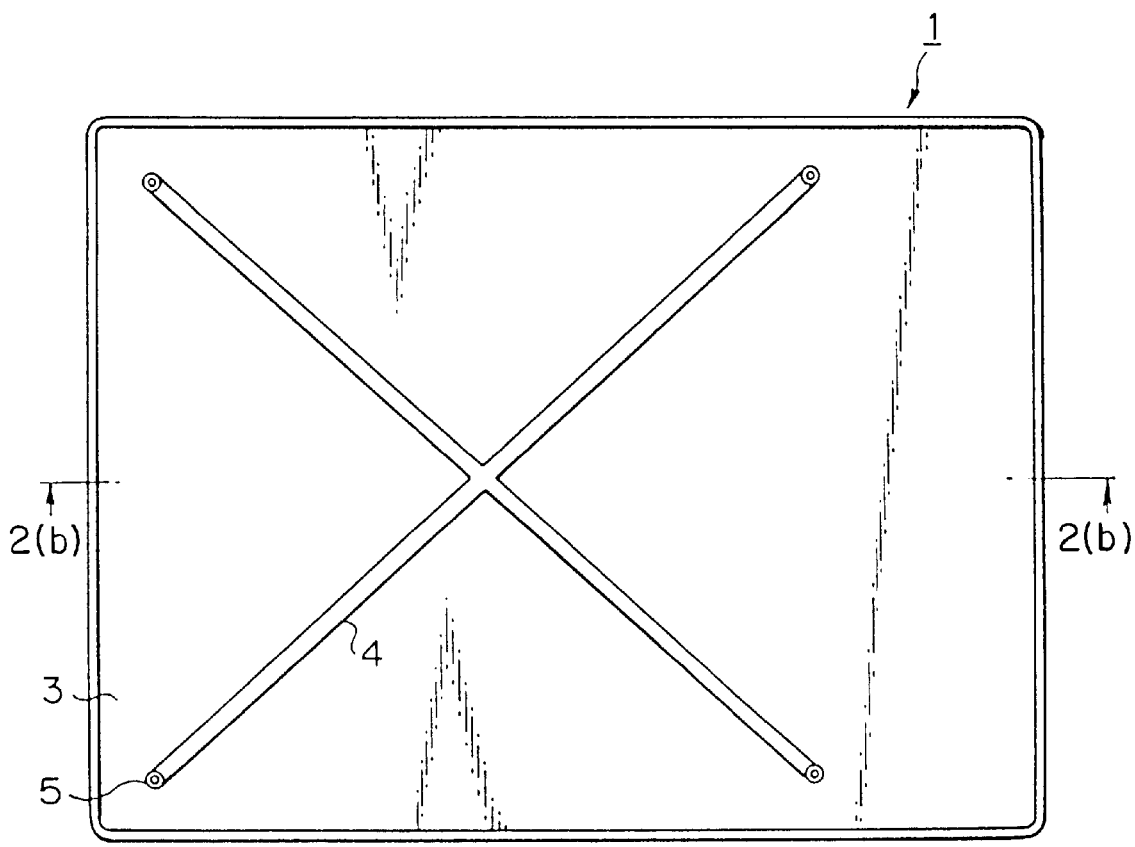
FIG. 2(a) is a plan view of a housing according to an embodiment of this invention.
Figure 2B:
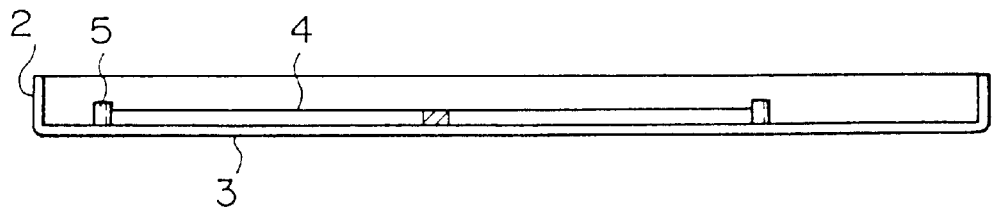
FIG. 2(b) is a cross-sectional view taken along line b—b in FIG. 2(a)

Referring now to the drawings, wherein FIG. 1(a) is a schematic perspective view of model I or II, FIG. 1(b) is a cross-sectional view taken along line b—b in FIG. 1(a) and showing the model I, and FIG. 1(c) is the same cross-sectional view as in FIG. 2(b), but showing the model II;

The box-shaped plastic housing structure 1 comprises a substantially flat-shaped bottom wall 3 and an upright wall 2 extending upwardly from the peripheral edge of the bottom wall 3. The bottom wall 3 and the upright wall 2 cooperatively define an integral box-shaped mold structure. In the model I shown in FIGS. 1(a) and 1(b), the thickness of the bottom wall 3 and the thickness of the peripheral upright wall 2 are the same and the surface area of the upright wall 2 is not more than one-half of the area of the bottom wall 3.

In an experiment, an external bending and twisting force was exerted on the model I shown in FIGS. 1(a) and 1(b), and the internal stress generated against the external force was monitored. As to the results, a relatively large stress was generated on the peripheral upright wall 2, but almost no stress was generated on the bottom wall 3 having the relatively larger surface area.

In the model II shown in FIG. 1(c), the thickness of the peripheral upright wall 2 was increased to disperse the stress and, on the other hand, the thickness of the bottom wall 3 was reduced since it does not directly bear the stress, so that the entire volume of the housing wall, i.e., the weight of the housing, could be minimized. Thus, the deformation caused by an external force could be minimized.

Figure 3A:
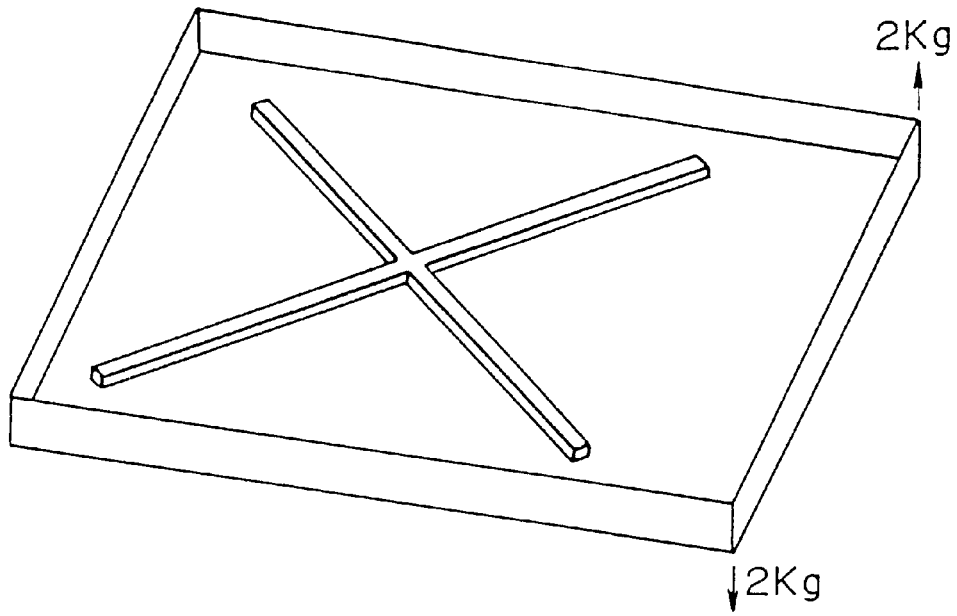
FIG. 3(a) is a perspective view of a model shown in FIG. 2, the thickness of the upright wall being 1.0 mm.
Figure 3B:
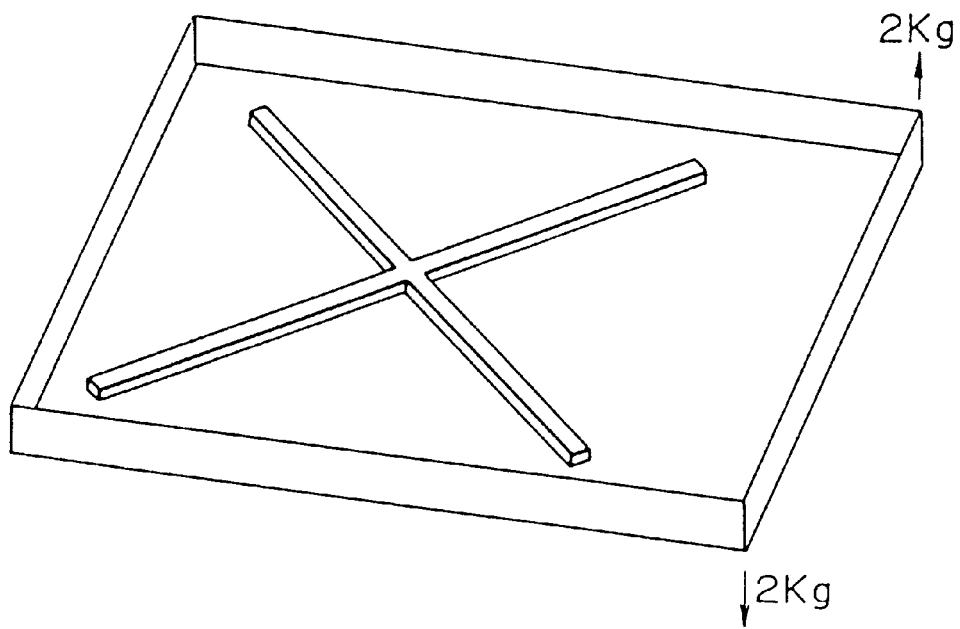
FIG. 3(b) is a perspective view of the same model as in FIG. 3(a), but with the thickness of the upright wall being 2.0 mm.

In a model of the molded product of a housing structure shown in FIG. 2, a resistance force against the deformation was simulated. In FIG. 3(a), a model as shown in FIG. 2 was used, wherein the thickness of the bottom wall 3 and the thickness of the peripheral upright wall 2 are both 1.0 mm. The left side periphery of the housing was completely fixed. Conversely, a twisting force was exerted on the right side periphery of the housing, i.e., an upward force of 2 kg was exerted on the right rear corner thereof and, on the other hand, a downward force of 2 kg was exerted on the right front corner thereof. In FIG. 3(b), the thickness of the peripheral upright wall 2 was 2.0 mm and the other conditions were the same as FIG. 3(a).

The results were as follows. In the case of FIG. 3(a), the maximum deformation was 5.3 mm at the right front corner and the maximum internal stress was 7 kgf/cm$^2$ at the left side periphery. Conversely, in the case of FIG. 3(b), the maximum deformation was 3.1 mm and the maximum internal stress was 4 kgf/cm$^2$. Thus, both the maximum deformation and the maximum internal stress were significantly reduced.

As shown in FIG. 2(a) housing is provided with several cylindrical bosses 5 which can be used for receiving the screws, particularly, tapping screws snap fittings, or insert threads, for affixing thereto a printed circuit board, connectors, or a housing cover.

In injection molding of a plastic housing, if the knockout pins 11 (see FIG. 5) were arranged only on the thin wall portion the molded product would be pushed by contact at its weakest positions and thus, deformation would be increased. Therefore, according to the present invention, cylindrical bosses 5 are arranged on the intermediate positions or on the intersections of the ribs 4. Thus, these cylindrical bosses 5 are pushed by a cylindrical sleeve or knockout pin, so that the exerted force can be dispersed by the ribs 4 to the thin wall portion and, therefore, the deformation can be minimized.

FIG. 2(a) is a plan view of the molded product of a housing structure according to the present invention, and FIG. 2(b) is a cross-sectional view taken along line b—b in FIG. 2(a).

This embodiment is a body cover (housing) of a notebook type personal use computer which is A4 sized and has a bottom wall 3 of 1.0 mm thickness, a peripheral upright wall 2 of 15 mm height and 2.0 mm thickness, and X-shaped cross ribs 4 on the bottom wall 3. This housing was made by injection molding of a new material, i.e., denatured or modified polyphenylene oxide containing carbon fibers. For comparing with this embodiment, an comparative example of the housing was made in the same manner as the above, except that the thickness of the peripheral upright wall 2 was 1.0 mm.

The left side periphery of each sample thus made was completely fixed. Conversely, a twisting force was exerted on the right side periphery of the housing, i.e., a downward force of 2 kg was exerted on the right front corner thereof and, on the other hand, a upward force of 2 kg was exerted on the right rear corner thereof. The stress thus generated in the housing and the deformation thereof were measured by a monitoring robot. The results were as follows. The maximum deformation of this embodiment was 3.0 mm, but the maximum deformation of the comparative example was 5.8 mm. It should be noted that the results were quite similar to the results of the simulation testing, as mentioned above. In the embodiment, the deformation could be significantly reduced by increasing the thickness of the peripheral upright wall 2 by only 1.0 mm, with an increase of the weight by only 10 g.

If the thickness of the bottom wall 3 was less than 0.6 mm, a housing having a large bottom wall could not be obtained. Conversely, if the thickness of the bottom wall 3 was more than 2.5 mm, it would be impossible to obtain a light weight housing as compared with a conventional housing. Also, if the thickness of the peripheral upright wall 2 was more than 3.0 mm, it would also be impossible to reduce the weight of the housing, although the strength thereof could be increased.

Figure 4:
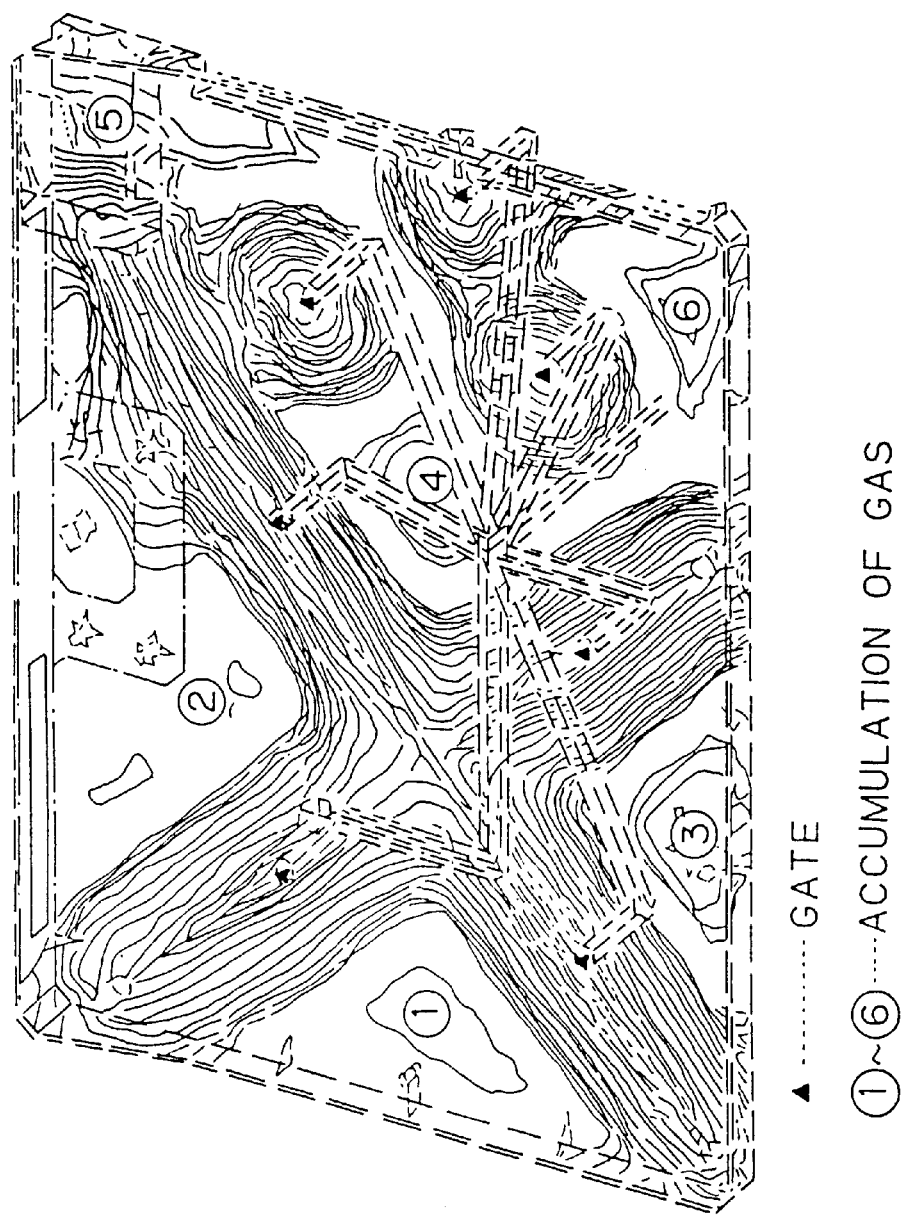
FIG. 4 shows results of a simulation of resin flow for determining a mold structure.

FIG. 4 shows the results of a simulation of resin flow for determining a mold structure. In this embodiment, the model is a notebook type personal use computer which is A4 sized and has a bottom wall 3 of 1.0 mm thickness and a peripheral upright wall 2 of 10 mm height. The rear portion of this peripheral upright wall 2 of 18 mm height is provided with a mounting hole, such as for a connector. The bottom wall 3 is provided with X-shaped cross ribs 4 of 5×5 mm. Also, four gates ate arranged on the ribs and three gates (gates are indicated by triangle marks as shown in FIG. 4) are arranged on the thin plate portions of 1.0 mm thickness which are not provided with ribs 4 to facilitate flowing of the molten plastic in that area. Each of the gates arranged on a corresponding thin plate portion is provided with a button-like receiving portion. The results of the simulation were, as shown in FIG. 4, that the resin enters the mold cavity through the seven gates and the bottom wall is formed with six flow ends ① to ⑥ where gas accumulates.

Figure 5:
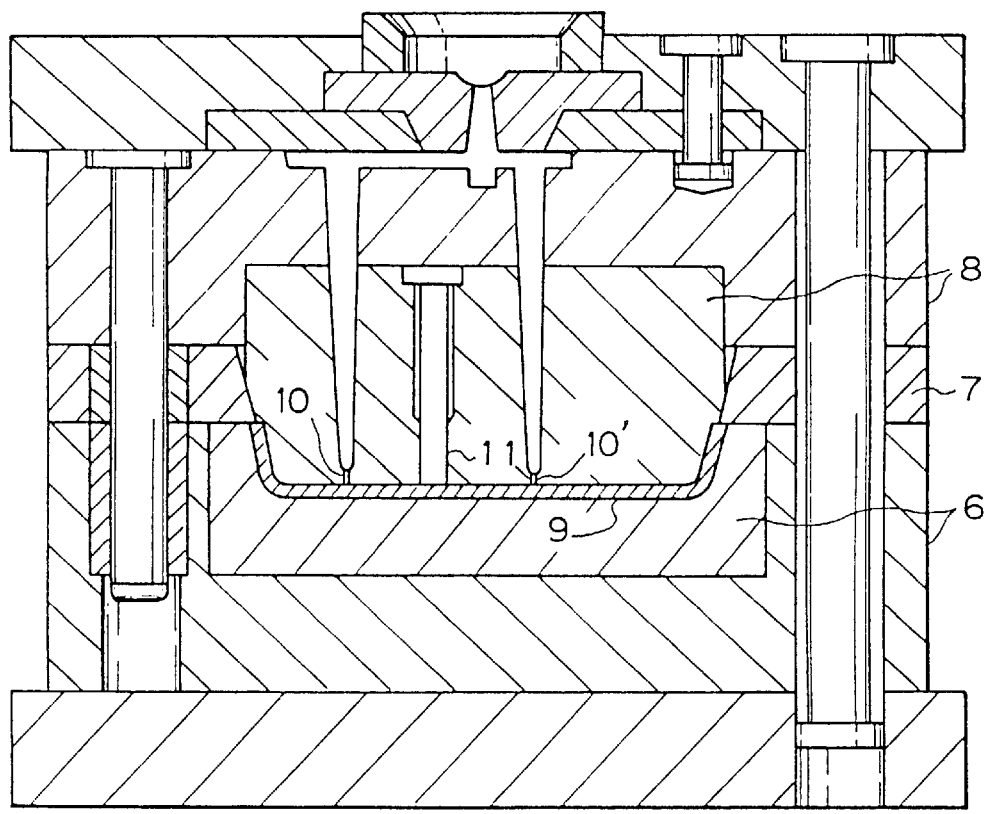
FIG. 5 is a cross-sectional view showing an embodiment of a mold structure according to the present invention.
Figure 6A:
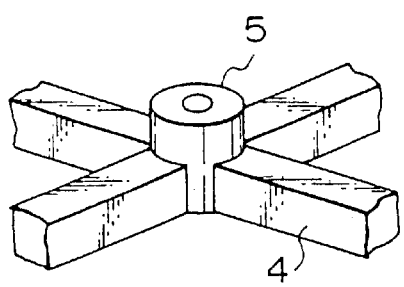
FIGS. 6(a), 6(b), 6(c) and 6(d) show embodiments of a boss or knockout pin structure.
Figure 6B:
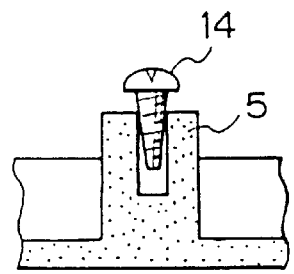
Figure 6C:
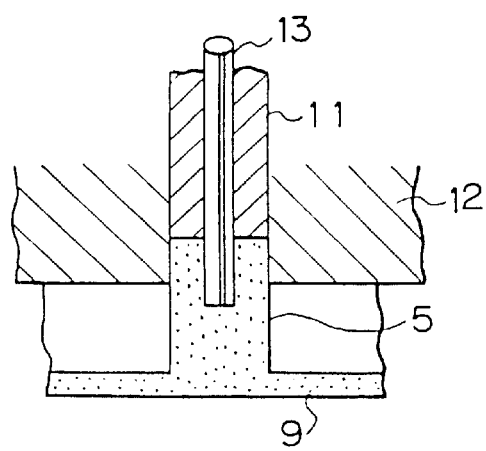
Figure 6D:
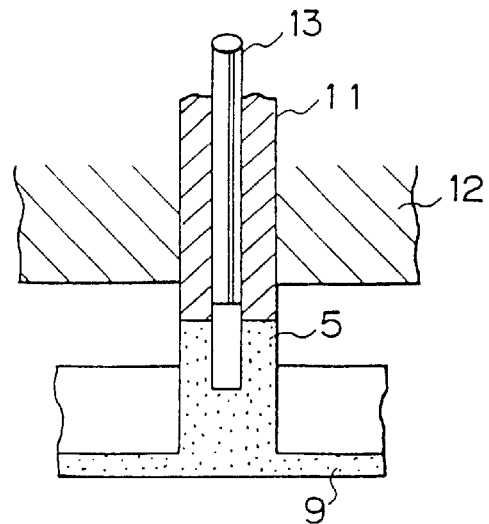

FIG. 5 is a cross-sectional view of an embodiment of a mold structure according to the present invention and FIGS. 6(a), 6(b), 6(c) and 6(d) show embodiments of a boss and/or knockout pin engaging structure. The mold structure associated with a molded product 9 shown in FIG. 5 comprises a lower mold 6, an intermediate mold 7, and an upper mold 8. The upper mold 8 is provided with gates 10 and 10' which provide inlets for the molten resin and is provided at the positions of the gas accumulation with knockout pins 11 each having a sintered metal tip. Also, in order to reduce the deformation when the molded product is discharged from the cavity, as shown in FIG. 6(a), the molded product 9 further is provided, on the ribs 4 or on the intersection of the ribs 4, with cylindrical bosses 5 which are used as the main knockout pin engaging structures. In addition, as shown in FIGS. 6(c) and 6(d), the mold 12 is provided with sleeve-like knockout pins 11 and fixing pins 13, so that the molded products 9 can be pushed out of the cavity, as shown in FIG. 6(d). The cylindrical bosses 5 thus formed by the mold thereafter can be used as connectors e.g., as screw holes, for receiving screws, particularly, tapping screws, snap fittings, or insert threads, for affixing a printed circuit board, connectors, or a housing cover thereto, as shown in FIG. 6(b).

According to the mold structure of the present invention, the rib portions 4 and a relatively thick peripheral upright wall 2 are used as passageway for the molten resin in the injection molding and, therefore, the gates 10 and 10' can be arranged on the rib portions 4 or on at least two positions in the vicinity of the peripheral upright wall 2, so that the resin can more smoothly flow. Also at, the positions of the bottom wall, to which the resin finally reaches there are provided, telescopic or knockout pins each having a structure through which the air (i.e., gas) easily escapes (for example, a structure having a gap, a groove-like vent, sintered alloy, or the like) are provided. Thus, resin firing due to overheating of the resin by a short shot or adiabatic compression of the air is prevented.

Thus, according to the mold structure of the present invention, a thin molded product can be obtained without a short shot, deformation and gas-firing. In an embodiment of the housing used for the notebook type computer, a weight of the housing can be reduced to about 350 g by reducing the thickness of the main wall to 1.0 mm, as compared with a conventional type housing having a weight of about 750 g. In this case, the deformation of the embodiment due to an external force is substantially the same as a conventional housing.

FIG. 7 is a plan view of a housing structure applied to this invention, i.e., a lower cover of a personal use notebook type computer of a type in practical use. As will be seen in FIG. 7, the shape of this housing is more complicated when compared with the embodiment shown in FIGS. 2(a) and 2(b), although the principle of this invention is also applied to this housing. Namely, the thickness of the bottom wall is in the range of two-thirds to one-third with respect to the thickness of the peripheral upright wall, e.g., the thickness of the bottom wall is 1.0 mm and the thickness of the peripheral upright wall is 2.0 mm. There are many ribs in this example and, in the same manner as the above, these ribs can be used as passageways for flowing therethrough the molten resin.

It should be understood by those skilled in the art that the foregoing description relates to only a preferred embodiment of the disclosed invention, and that various changes and modifications may be made to the invention without departing from the spirit and scope thereof.

We claim:

1. A box-shaped plastic housing comprising:

a substantially planar bottom wall having a peripheral edge, an upright wall integrally joined at a bottom edge thereof to, and extending upwardly from, said peripheral edge of said bottom wall, said bottom wall and said upright wall cooperatively defining an integral, box-shaped molded structure, and said bottom wall having a thickness in the range of from two-thirds to one-third the thickness of said upright wall; and said bottom wall and said upright wall having respective inner surfaces cooperatively defining the inside surface of said box-shaped structure, and said bottom wall further comprises at least one rib structure formed integrally on said inner surface thereof, each rib structure extending along a respective direction relative to said inner surface and associated peripheral edge of said bottom wall.

2. A box-shaped plastic housing as set forth in claim 1, further comprising a cylindrical boss formed on a respective rib structure and having an axis perpendicular to the direction along which said respective rib structure extends, said cylindrical boss defining a connector and a knock-out pin engaging structure.

3. A box-shaped plastic housing as set forth in claim 1, further comprising first and second said rib structures extending in respective, first and second intersecting directions such that they cross each other and form an integral intersection therebetween, said cylindrical boss being formed on said first and second rib structures at said integral intersection therebetween and having an axis perpendicular to each of the first and second directions.

4. A box-shaped plastic housing for a portable-type electronic unit of integrally molded resin, said housing being made by injection molding and comprising:

a substantially planar and rectangular bottom wall having a peripheral edge, an upright wall integrally joined at a bottom edge thereof to, and extending upwardly from, said peripheral edge of said bottom wall, said bottom wall and said upright wall cooperatively defining an integral, box-shaped molded structure, said bottom wall and said upright wall having respective surface areas, the surface area of said upright wall being not more than one-half of the surface area of said bottom wall and said bottom wall having a thickness in the range of from two-thirds to one-third the thickness of said upright wall; and said bottom wall and said upright wall having respective inner surfaces cooperatively defining the inside surface of said box-shaped structure, and said bottom wall further comprises at least one rib structure formed integrally on said inner surface thereof, each rib structure extending along a respective direction relative to said inner surface and associated peripheral edge of said bottom wall.

5. A box-shaped plastic housing as set forth in claim 4, further comprising a cylindrical boss formed on a respective rib structure and having an axis perpendicular to the direction along which said respective rib structure extends, said cylindrical boss defining a connector and a knock-out pin engaging structure.

6. A box-shaped plastic housing as set forth in claim 4, further comprising first and second said rib structures extending in respective, first and second intersecting directions such that they cross each other and form an integral intersection therebetween, said cylindrical boss being formed on said first and second rib structures at said integral intersection therebetween and having an axis perpendicular to each of the first and second directions.

7. A box-shaped plastic housing as set forth in claim 1, wherein said upright wall has an average thickness of not more than 3.0 mm.

8. A box-shaped plastic housing as set forth in claim 1, wherein said bottom wall and said upright wall have respective surface areas, the surface area of said upright wall being not more than one-half of the surface area of said bottom wall.

9. A box-shaped plastic housing as set forth in claim 4, wherein said upright wall has an average thickness of not more than 3.0 mm.

* * * * *